(12) United States Patent
Blackshear et al.

(10) Patent No.: US 9,743,526 B1
(45) Date of Patent: Aug. 22, 2017

(54) WIRING BOARD WITH STACKED EMBEDDED CAPACITORS AND METHOD OF MAKING

(71) Applicants: International Business Machines Corporation, Armonk, NY (US); SHINKO ELECTRIC INDUSTRIES CO., LTD, Nagano-Shi (JP)

(72) Inventors: Edmund Blackshear, Wappingers Falls, NY (US); Keiichi Hirabayashi, Nagano (JP); Yoichi Miyazawa, White Plains, NY (US); Brian W. Quinlan, Poughkeepsie, NY (US); Junji Sato, Nagano (JP)

(73) Assignees: INTERNATIONAL BUSINESS MACHINES CORPORATION, Armonk, NY (US); SHINKO ELECTRIC INDUSTRIES CO. LTD, Nagano-Shi (JP)

( * ) Notice: Subject to any disclaimer, the term of this patent is extended or adjusted under 35 U.S.C. 154(b) by 0 days.

(21) Appl. No.: 15/040,564

(22) Filed: Feb. 10, 2016

(51) Int. Cl.
*H05K 1/18* (2006.01)
*H05K 3/32* (2006.01)
(Continued)

(52) U.S. Cl.
CPC .......... *H05K 1/185* (2013.01); *H05K 1/0298* (2013.01); *H05K 1/115* (2013.01); *H05K 3/0047* (2013.01); *H05K 3/32* (2013.01); *H05K 3/4038* (2013.01); *H05K 3/4644* (2013.01); *H05K 2201/0959* (2013.01); *H05K 2201/10015* (2013.01);
(Continued)

(58) Field of Classification Search
CPC combination set(s) only.
See application file for complete search history.

(56) References Cited

U.S. PATENT DOCUMENTS

| 6,370,013 B1 * | 4/2002 | Iino ..................... H01G 4/2325 257/E23.062 |
| 6,734,542 B2 | 5/2004 | Nakatani et al. |

(Continued)

FOREIGN PATENT DOCUMENTS

| JP | 5505433 B2 | 5/2014 |
| JP | 2014082276 A | 5/2014 |

*Primary Examiner* — Hoa C Nguyen
(74) *Attorney, Agent, or Firm* — Cantor Colburn LLP; Steven Meyers

(57) ABSTRACT

A method of making a wiring board includes forming a first capacitor carrier layer with a first embedded chip capacitor, a first insulation layer disposed on an upper surface, a second insulation layer disposed on a lower surface, first upper and lower conductive vias in conductive contact with a first electrode, and second upper and lower conductive vias in conductive contact with a second electrode. The method also includes forming a second capacitor carrier layer similar to the first. The method further includes forming a bonded laminate comprising in sequence an upper insulation layer, the first capacitor carrier layer, a center insulation layer, the second capacitor carrier layer, and a lower insulation layer. The method also includes forming a through-hole through the laminate and forming a conductive coating within the through-hole to provide a conductive through-hole. A wiring board also includes the bonded laminate and the embedded capacitors.

20 Claims, 11 Drawing Sheets

(51) Int. Cl.
  *H05K 3/40* (2006.01)
  *H05K 1/11* (2006.01)
  *H05K 3/46* (2006.01)
  *H05K 3/00* (2006.01)
  *H05K 1/02* (2006.01)

(52) U.S. Cl.
  CPC ............ *H05K 2201/10515* (2013.01); *H05K 2201/10522* (2013.01); *H05K 2203/16* (2013.01)

(56) References Cited

U.S. PATENT DOCUMENTS

| | | | |
|---|---|---|---|
| 6,939,738 B2 | 9/2005 | Nakatani et al. | |
| 7,672,112 B2 | 3/2010 | Hattori et al. | |
| 7,995,352 B2 | 8/2011 | Inagaki et al. | |
| 8,116,091 B2 | 2/2012 | Inagaki et al. | |
| 8,804,361 B2 | 8/2014 | Machida et al. | |
| 8,829,357 B2 | 9/2014 | Mikado et al. | |
| 9,049,799 B2 | 6/2015 | Takizawa | |
| 9,420,683 B2 * | 8/2016 | Lee | H01L 23/49822 |
| 2003/0159852 A1 * | 8/2003 | Nakamura | G01R 31/2806 174/255 |
| 2005/0124148 A1 * | 6/2005 | Tuominen | H01L 23/5389 438/618 |
| 2006/0138591 A1 * | 6/2006 | Amey | H01L 23/49822 257/532 |
| 2007/0085188 A1 * | 4/2007 | Chang | H01L 23/5389 257/686 |
| 2008/0314632 A1 * | 12/2008 | Wu | H05K 1/115 174/263 |
| 2009/0094824 A1 * | 4/2009 | Iida | H05K 3/4608 29/846 |
| 2013/0105943 A1 | 5/2013 | Lai et al. | |
| 2014/0153205 A1 * | 6/2014 | Mikado | H05K 1/185 361/763 |

* cited by examiner

WIRING BOARD WITH STACKED EMBEDDED CAPACITORS AND METHOD OF MAKING

BACKGROUND

The present invention relates to a wiring board and a method of making the same, and more specifically, to a wiring board having stacked embedded capacitors and a method of making the same.

Low inductance capacitance in the range of microfarads is required for decoupling of microprocessor cores. There are a number of approaches for providing such capacitance, including incorporation of capacitance within the microprocessor, such as deep trench on-board capacitors, MIMcap, and interposer technologies, as well as incorporation of the capacitance onto the microprocessor wiring board, including surface mount capacitors, backside capacitors and embedded capacitors. While all of the above-mentioned approaches have been useful, they have limitations that may make them undesirable for use with advanced microprocessors having a relatively large number of cores, such as 16 to 24 cores. For example, the use of approaches that place the capacitance on the microprocessor are limited due to the circuit density associated with the large number of cores.

In this regard, the use of wiring boards with embedded capacitors is desirable to place the capacitors as close as possible to the microprocessor, including under or in the shadow of the microprocessor. However, wiring boards with current single-layer embedded capacitors are not capable of providing enough capacitors under the microprocessor. While wiring boards with stacked embedded capacitors have been proposed, the internal wiring architecture associated with these board designs does not provide sufficient interconnection capability and/or flexibility to allow the stacked capacitors to be accessed individually. For example, a wiring board with stack embedded capacitors is disclosed in US Patent Publication No. 2013/010594381A1. In this disclosure, the innermost electrodes of the stacked capacitors are electrically connected to one another. The innermost electrodes are not independently accessible which limits the flexibility of wiring board and microprocessor designers when using the stacked embedded capacitors in various circuit designs, particularly the ability to use the stacked embedded capacitors to provide needed decoupling capacitance in microprocessor circuit designs with large numbers of microprocessor cores.

Therefore, it is very desirable to develop stacked embedded capacitor designs that provide improved access to the capacitor electrodes and improved circuit design flexibility, including the ability to increase access to individual stacked embedded capacitors, particularly for use with microprocessors with a large size or footprint and relatively large numbers of cores, and more particularly where the capacitors may be embedded in the wiring board under the microprocessor.

SUMMARY

In one embodiment, a method of making a wiring board is disclosed. The method includes forming a first capacitor carrier layer having a first chip capacitor embedded therein. The method also includes forming a second capacitor carrier layer having a second chip capacitor embedded therein. The method further includes forming a bonded laminate comprising an upper insulation layer disposed on an upper surface of a first insulation layer of the first capacitor carrier layer, a center insulation layer disposed on a lower surface of a second insulation layer of the first capacitor carrier layer, the second capacitor carrier layer disposed on a lower surface of the center insulation layer, and a lower insulation layer disposed on a lower surface of a second insulation layer of the second capacitor carrier layer. The method also includes forming a through-hole that extends through the bonded laminate to an outer surface of the upper insulation layer and an outer surface of the lower insulation layer. The method further includes forming a conductive coating within the through-hole to provide a conductive through-hole.

In another embodiment, a wiring board is disclosed. The wiring board includes a bonded laminate. The bonded laminate comprises a first capacitor carrier layer, the first capacitor carrier layer comprising: a first core substrate having an upper surface, a lower surface, and a first opening portion, a first chip capacitor embedded in the first opening portion having a first electrode and a second electrode, a first insulation layer disposed on the upper surface, a second insulation layer disposed on the lower surface, a first upper conductive via in conductive contact with the first electrode and extending through the first insulation layer, a second upper conductive via in conductive contact with the second electrode and extending through the first insulation layer, a first lower conductive via in conductive contact with the first electrode and extending through the second insulation layer, a second lower conductive via in conductive contact with the second electrode and extending through the second insulation layer. The bonded laminate also comprises a second capacitor carrier layer, the second capacitor carrier layer comprising: a second core substrate having an upper surface, a lower surface, and a second opening portion, a second chip capacitor embedded in the second opening portion having a first electrode and a second electrode, a first insulation layer disposed on the upper surface, a second insulation layer disposed on the lower surface, a first upper conductive via in conductive contact with the first electrode and extending through the first insulation layer, a second upper conductive via in conductive contact with the second electrode and extending through the first insulation layer, a first lower conductive via in conductive contact with the first electrode and extending through the second insulation layer, a second lower conductive via in conductive contact with the second electrode and extending through the second insulation layer. The bonded laminate also includes an upper insulation layer disposed on an upper surface of the first insulation layer of the first capacitor carrier layer. The bonded laminate further includes a center insulation layer disposed on a lower surface of the second insulation layer of the first capacitor carrier layer, the second capacitor carrier layer disposed on a lower surface of the center insulation layer. The bonded laminate also includes a lower insulation layer disposed on a lower surface of the second insulation layer of the second capacitor carrier layer.

DETAILED DESCRIPTION

Figure 1:
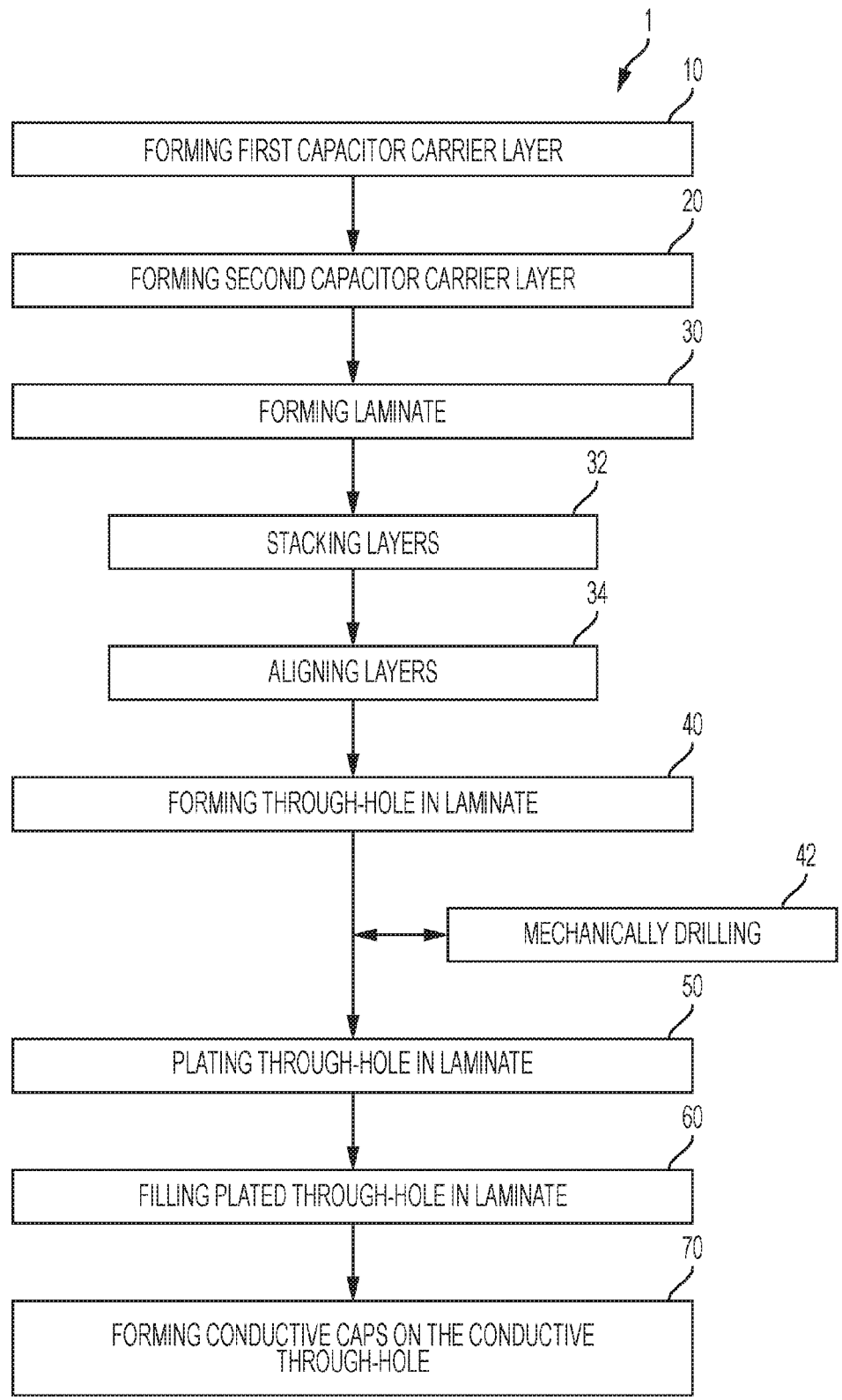
FIG. 1 is a flowchart illustrating an embodiment of a method of making a wiring board as described herein.
Figure 2:
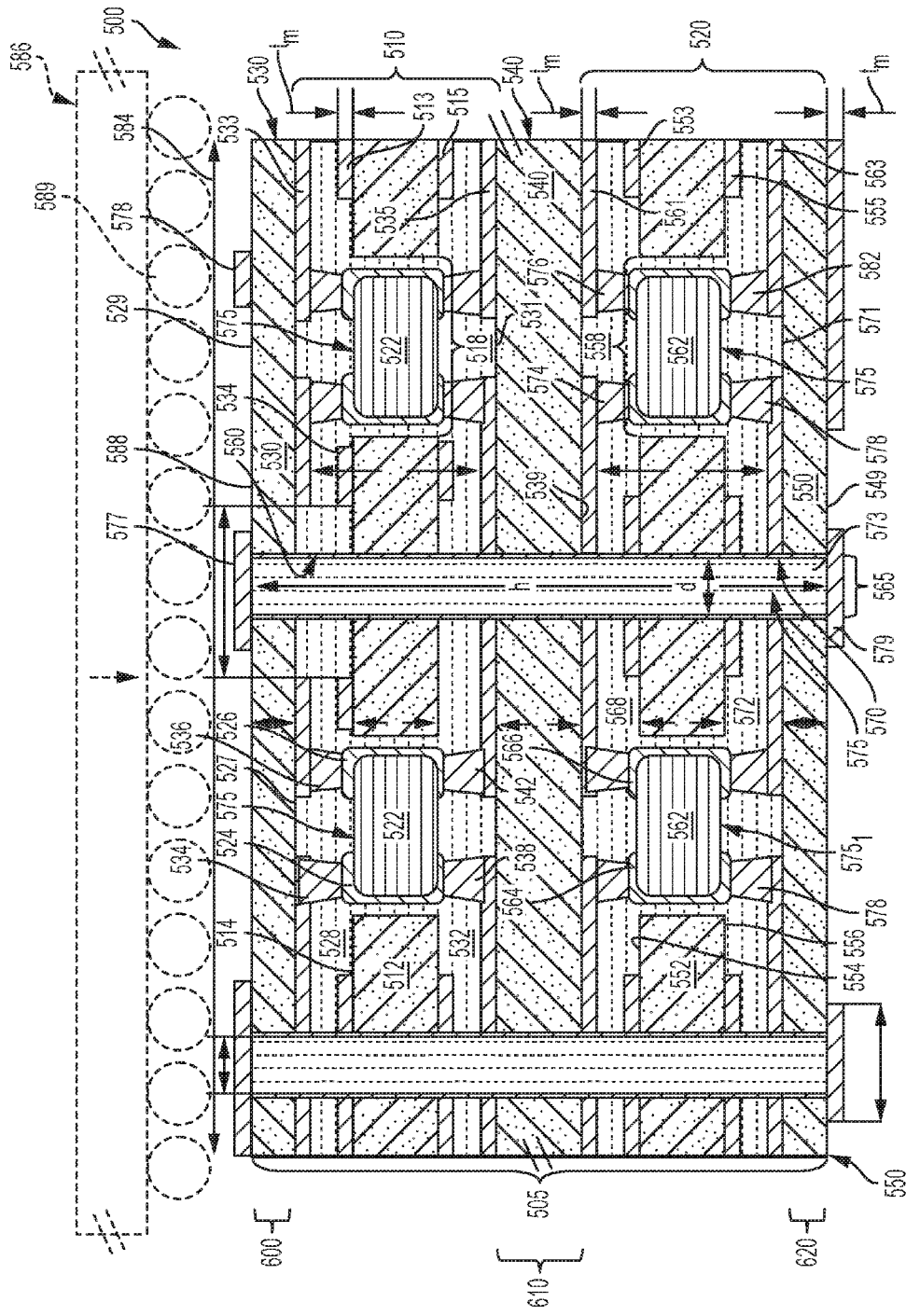
FIG. 2 is a schematic cross-sectional illustration of a wiring board having stacked embedded capacitors as described herein.

Referring to the Figures, and particularly FIGS. 1 and 2, a method 1 of making a wiring board 500, such as a printed wiring board, is disclosed. The method 1 includes forming 10 a first capacitor carrier layer 510. The method 1 also includes forming 20 a second capacitor carrier layer 520. The method 1 further includes forming 30 a bonded laminate 505 comprising an upper insulation layer 530 disposed on the first capacitor carrier layer 510, an opposed center insulation layer 540 disposed on the first capacitor carrier layer 510, the second capacitor carrier layer 520 disposed on the center insulation layer 540 opposite the first capacitor carrier layer 510, and a lower insulation layer 550 disposed on the second capacitor carrier layer 520 opposite the center insulation layer 540. Still further, the method 1 includes forming 40 a through-hole 560 that extends through the bonded laminate 505 from the upper insulation layer 530 to the lower insulation layer 550. The method 1 also includes forming 50 a conductive coating 570 within the through-hole 560 to provide a conductive through-hole 565. The method 1 is particularly advantageous because it enables the construction of a wiring board 500 that includes a large number of stacked embedded capacitors 575, such as 24-48 capacitors, that can be utilized as decoupling capacitors for very large (e.g. 28 mm×28 mm, or 28 mm×25 mm) multi-core (e.g. 16-24 core) microprocessors 586. In addition, the construction of the wiring board 500 using a large number of stacked embedded capacitors 575 allows the capacitors to be placed as closely as possible to the microprocessor 586 without being incorporated into or onto the microprocessor. The method 1 and wiring board 500 provide a new method and apparatus for effectively decoupling very large size microprocessors 586 on the wiring board 500.

The method 1 includes forming 10 a first capacitor carrier layer 510. The first capacitor carrier layer 510 comprises a first core substrate 512 having an upper surface 514, a lower surface 516, and a first opening portion 518. The first core substrate 512 may have any suitable thickness, including in various embodiments about 150 to about 250 µm, and more particularly about 175 to about 225 µm, and including in one embodiment about 200 µm. A first chip capacitor 522 is embedded in the first opening portion 518 having a first electrode 524 and a second electrode 526. A first insulation layer 528 is disposed on the upper surface 514. A second insulation layer 532 is disposed on the lower surface 516. The insulation layers 528, 532 may also include respective metallization layers 533, 535 on their outer surfaces, for example, having any suitable thickness ($t_m$), which in an embodiment may be about 21 to about 25 µm (21 µm nominal). The first core substrate 512 may have metallization layers 513, 515 on its outer surfaces having any suitable thickness ($t_m$), which in an embodiment may be about 21 to about 25 µm. A first upper conductive via 534 is in conductive contact with the first electrode 524 and extending through the first insulation layer 528. A second upper conductive via 536 is in conductive contact with the second electrode 526 and extending through the first insulation layer 528. A first lower conductive via 538 is in conductive contact with the first electrode 524 and extending through the second insulation layer 532. A second lower conductive via 542 is in conductive contact with the second electrode 526 and extending through the second insulation layer 532. The first capacitor carrier layer 510 may have any suitable thickness, which in various embodiments may range from about 350 to about 550 µm, and more particularly about 400 to about 500 µm, and even more particularly about 425 to about 475 µm, and including in one embodiment about 450 µm. The insulation layers 528, 532 may have any suitable thickness, including about 150 to about 250 µm, and more particularly about 175 to about 225 µm, and including in one embodiment about 200 µm. The chip capacitors 522 may have any suitable thickness, and will generally have a thickness less than the sum of the thicknesses of the metallization layers 533, 535 and first core substrate 512, which in one embodiment is less than about 150 to 220 µm.

The method 1 also includes forming 20 a second capacitor carrier layer 520. The second capacitor carrier layer 520 comprises a second core substrate 552 having an upper surface 554, a lower surface 556, and a second opening portion 558. The second core substrate 552 may have any suitable thickness, including in various embodiments about 150 to about 250 µm, and more particularly about 175 to about 225 µm, and including in one embodiment about 200 µm. A second chip capacitor 562 is embedded in the second opening portion 558 having a first electrode 564 and a second electrode 566. A first insulation layer 568 is disposed on the upper surface 554. A second insulation layer 572 is disposed on the lower surface 556. The insulation layers 568, 572 may also include respective metallization layers 561, 563 on their outer surfaces, for example, having any suitable thickness, which in an embodiment may be about 21 to about 25 µm (21 µm nominal). The second core substrate 542 may have metallization layers 553, 555 on its outer surfaces having any suitable thickness ($t_m$), which in an embodiment may be about 21 to about 25 µm (21 µm nominal). A first upper conductive via 574 is in conductive contact with the first electrode 564 and extending through the first insulation layer 568. A second upper conductive via 576 is in conductive contact with the second electrode 566 and extending through the first insulation layer 568. A first lower conductive via 578 in conductive contact with the first electrode 564 and extending through the second insulation layer 572. A second lower conductive via 582 is in conductive contact with the second electrode 566 and extending through the second insulation layer 572. The second capacitor carrier layer 520 may have any suitable thickness, which in various embodiments may range from about 350 to about 550 µm, and more particularly about 400 to about 500 µm, and even more particularly about 425 to about 475 µm, and including in one embodiment about 450 µm. The insulation layers 568, 572 may have any suitable thickness, including about 150 to about 250 µm, and more particularly about 175 to about 225 µm, and including in one embodiment about 200 µm. The chip capacitors 562 may have any suitable thickness, and will generally have a thickness less than the sum of the thicknesses of the metallization layers 553, 555 and second core substrate 552, which in one embodiment is less than about 150 to 220 µm.

The method 1 also includes forming 30 a bonded laminate 505 comprising an upper insulation layer 530 disposed on an upper surface 527 of the first insulation layer 528 of the first capacitor carrier layer 510. The bonded laminate 505 also includes a center insulation layer 540 disposed on a lower surface 531 of the second insulation layer 532 of the first capacitor carrier layer 510. The bonded laminate 505 also includes the second capacitor carrier layer 520 disposed on a lower surface 539 of the center insulation layer 540, and a lower insulation layer 550 disposed on a lower surface 571 of the second insulation layer 572 of the second capacitor carrier layer 520. In one embodiment, forming 30 a bonded laminate 505 comprises 1) stacking 32, in sequence: an upper preimpregnated or prepreg layer 600 comprising an uncured polymer resin embedded in a plurality of fibers, the first capacitor carrier layer 510, a center prepreg layer 610, the second capacitor carrier layer, and a lower prepreg layer 620; pressing the stacked layers; and 3) curing 36 or polymerizing the uncured polymer resin of the upper prepreg layer 600, the center prepreg layer 610, and the lower prepreg layer 620 to form the bonded laminate 505 and the upper insulation 530, center insulation layer 540, and lower insulation layer 550. Any suitable prepreg materials may be used, including any suitable resin and fiber materials, such as, for example, various epoxy and glass fiber materials.

The method 1 further includes forming 40 a through-hole 560 that extends through the bonded laminate 505 to an outer surface 529 of the upper insulation layer 530 and an outer surface 549 of the lower insulation layer 550. In one embodiment, forming 40 a through-hole 560 that extends through the bonded laminate 505 comprises mechanically drilling 42 through the bonded laminate 505 with a computer controlled mechanical drill. The through-hole may have any suitable size, including any suitable diameter (d) and height. In one embodiment, the through-hole is about 200 µm in diameter, and the height (h) of the through-hole extends through the thickness of the bonded laminate 505, which in one embodiment is 800 to 1200 µm. The through-hole 560 may include a plurality of through-holes which may be located throughout the wiring board 500 in any predetermined location(s) thereof.

The method 1 may also include forming 50 a conductive coating 570 within the through-hole 560 to provide a conductive through-hole 565. In one embodiment, forming 50 a conductive coating 570 within the through-hole comprises plating, either using electrolytic plating or electroless plating, of a metal coating layer 571 within and around the entirety of the periphery of the through-hole 560. In one embodiment, the metal coating layer 571 comprises a pure metal or a metal alloy, and more particularly may comprise copper or a copper alloy, including those described herein. The method 1 may also include filling 60 the conductive through-hole 565 with an insulator 573 to form an insulator-filled conductive through hole 575. The insulator may include any suitable resin, including a resin that is different than the resin used to form the upper, center and lower prepreg layers. The insulator-filled conductive through hole 575 is very advantageous because it provides a common electrical path through the thickness of the wiring board 500, which is useful for supplying a power and/or a ground bus through the entire thickness of the wiring board 500, as well as enabling signal communication between any of the respective layers of wiring board 500. The insulator-filled conductive through hole 575, and portions of method 1 used to make it, is also very advantageous because it does not require through-hole build, generally with solid metal through holes, during forming 10 of each of the various layers of first capacitor carrier 510 and forming 20 of each of the various layers of second capacitor carrier 520, or significantly reduces the number of solid metal through-holes required. In one embodiment, the method 1 and forming 40 a through-hole 560, forming 50 a conductive coating 570, and filling 60 the conductive through-hole 565 with an insulator 573 may be employed to incorporate a plurality of through-holes 560 and corresponding conductive coatings 570 and insulators 573, such that wiring board 500 includes a plurality of insulator-filled conductive through holes 575. In one embodiment, method 1 also may include forming 70 an upper conductive cap 577 and a lower conductive cap 579 over the insulator filled conductive through hole 575, and in other embodiments, a plurality of upper conductive caps 577 and lower conductive caps 579 over a plurality of insulator filled conductive through holes 575 may be made by forming 70. The upper conductive caps 577 and lower conductive caps 579 may include a metal, such as copper or various copper alloys, and may be formed by any suitable method, such as plating as described herein, for example.

In one embodiment, the method 1 and forming 10 the first capacitor carrier layer 510 is performed such that the first upper conductive via 534, the second upper conductive via 536, the first lower conductive via 538, and the second lower conductive via 542 of the first capacitor layer 510 are configured for independent electrical connection to respective independent electrical conductors of the first capacitor carrier layer 510. Similarly, the method 1 and forming 20 the second capacitor carrier layer 520 are performed such that first upper conductive via 574, the second upper conductive via 576, the first lower conductive via 578, and the second lower conductive via 582 are configured for independent electrical connection to respective independent electrical conductors of the second capacitor layer 520. This is very advantageous because the independent electrical connection of the stacked first chip capacitor and second chip capacitor through their respective vias enables their use individually as decoupling capacitors, for example, such that they can be used to decouple different cores within a multi-core microprocessor. This provides significantly improved circuit design flexibility to circuit designers as compared to prior art stacked capacitor designs, for example, where the adjacent electrodes of the stacked capacitors were electrically connected to one another.

In one embodiment of method 1, stacking 32 includes aligning 34 the first capacitor carrier layer 510 relative to the second capacitor carrier layer 520 so that the first chip capacitor 522 is disposed above the second chip capacitor 562. In another embodiment of method 1 and wiring board 500, the first chip capacitor 522 comprises a plurality of first chip capacitors 522 embedded in a plurality of spaced apart first opening portions 518 and the second chip capacitor comprises a plurality of second chip capacitors 562 embedded in a plurality of spaced apart second opening portions 558. In this embodiment, aligning 34 comprises aligning the first capacitor carrier layer 510 relative to the second capacitor carrier layer 520 so that the first chip capacitors 522 are disposed above respective second chip capacitors 562. In this embodiment of method 1 and wiring board 500, wiring board 500 may also include a microprocessor bonding portion 584 that is configured for electrical connection of a microprocessor 586, such as by the incorporation of a plurality of bonding contacts or pads 587 within a predetermined area roughly corresponding to the length and width of the microprocessor 586 on the outermost surface 588 of the wiring board 500, wherein the plurality of first chip capacitors 522 and the plurality of second chip capacitors 562 are embedded within the wiring board 500 under the microprocessor bonding portion 584. As an example, the size of the microprocessor bonding portion 584 may be the same as the microprocessor sizes described herein (e.g. 28 mm×28 mm, or 28 mm×25 mm), and may include any suitable number of C4 contacts or pads 589 (FIG. 2), including in certain embodiments up to about 24,000 bonding contacts or pads 587.

Forming 10 the first capacitor carrier layer 510 and forming 20 the second capacitor carrier layer 520 may be performed using the same methods and materials. Any suitable methods and materials may be used. In one embodiment, forming 10 the first capacitor carrier layer 510 and forming 20 the second capacitor carrier layer 520 may be performed using the methods and materials described in U.S. Pat. No. 8,829,357, which is herein incorporated by reference in its entirety. In one embodiment, forming 10 the first capacitor carrier layer 510 and forming 20 the second capacitor carrier layer 520 may be performed as described below.

Figure 3:
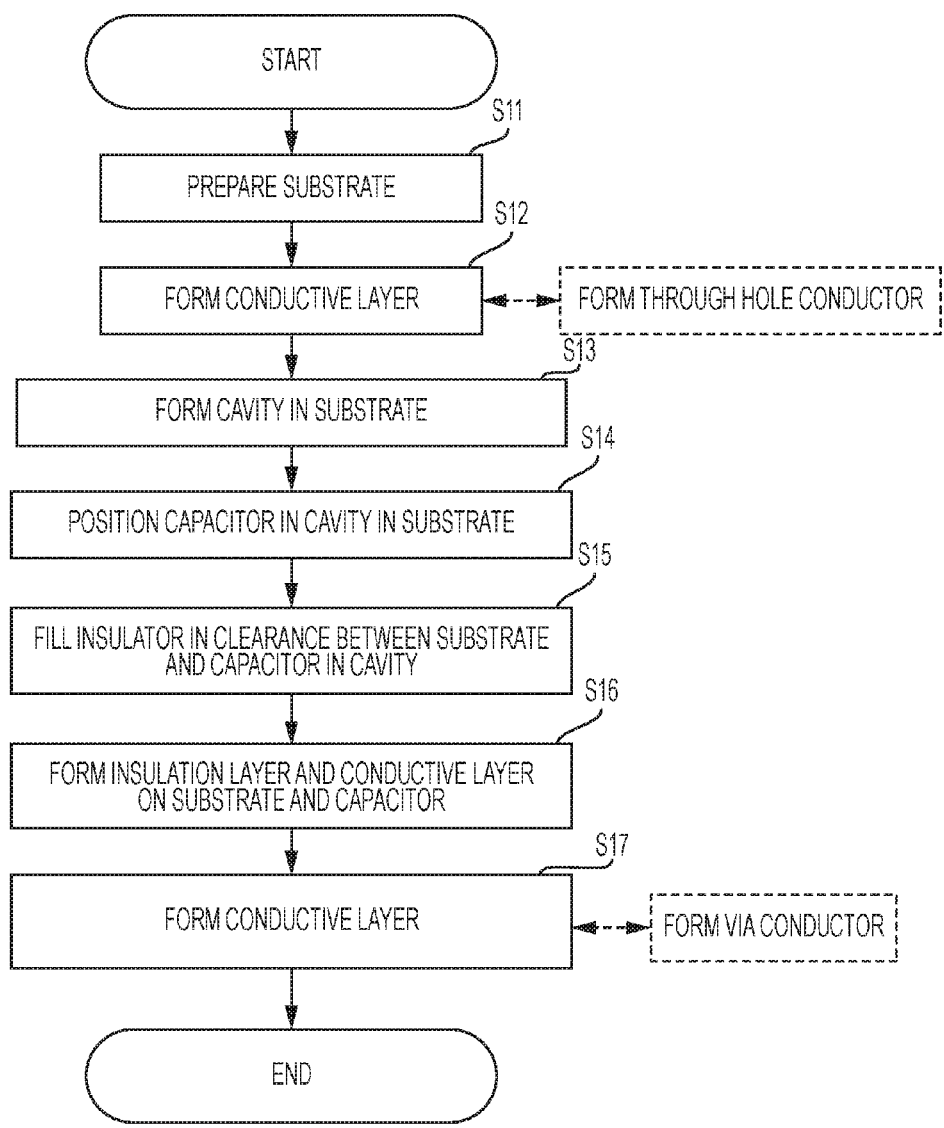
FIG. 3 is a flowchart showing one embodiment of a method for manufacturing a capacitor carrier layer as described herein.

A method for forming 10 the first capacitor carrier layer 510 and/or forming 20 the second capacitor carrier layer 520 is described with reference to FIG. 3 and others. FIG. 3 is a flowchart roughly showing the contents and operations for forming 10 the first capacitor carrier layer 510 and/or forming 20 the second capacitor carrier layer 520 according to one embodiment.

Figure 4:
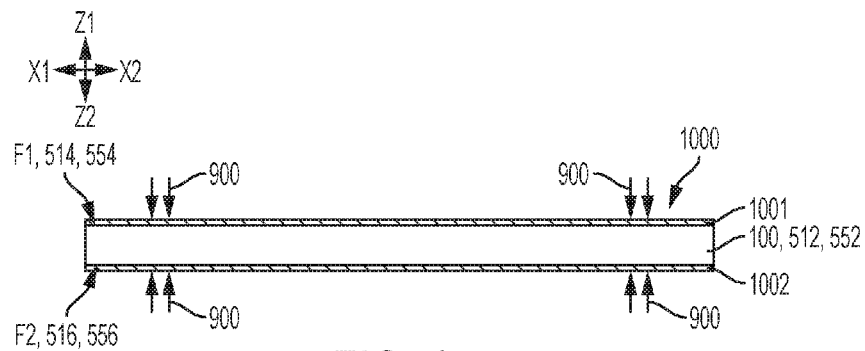
FIG. 4 is a view to illustrate an operation for preparing a substrate (core substrate) in the manufacturing method shown in FIG. 3.

In operation (S11), a double-sided copper-clad laminate 1000 is prepared as a starting material as shown in FIG. 4. The double-sided copper-clad laminate 1000 has substrate 100, 512, 552 (core substrate), a copper foil 1001 formed on first surface (F1, 514, 554) of substrate 100, 512, 552, and a copper foil 1002 formed on second surface (F2, 516, 556) of substrate 100, 512, 552. In the present embodiment, substrate 100, 512, 552 is made of glass epoxy completely cured at this stage.

Next, in operation (S12) in FIG. 3, an optional through-hole conductor (300b) and conductive layers (301, 513,553; 302) are formed in FIGS. 4-19. The through-hole conductor (300b) and associated through-hole via conductors (312b, 322b) are optional (FIG. 19). In one embodiment, the wiring board 500 includes only conductive through-holes 565 that extend through the entire thickness of the board as illustrated in FIG. 2. In other embodiments, the wiring board 500, and first capacitor carrier layer 510 and/or second capacitor carrier layer 520, include both conductive through-holes 565 and conductive through-holes within the carrier layers, including the through-hole conductor (300b) and associated through-hole via conductors (312b, 322b), which provide additional internal conductor paths within the wiring board, and provide enhanced design flexibility and circuit density within the board, as described in operations S12-S17 and illustrated in FIGS. 4-19.

Figure 5:
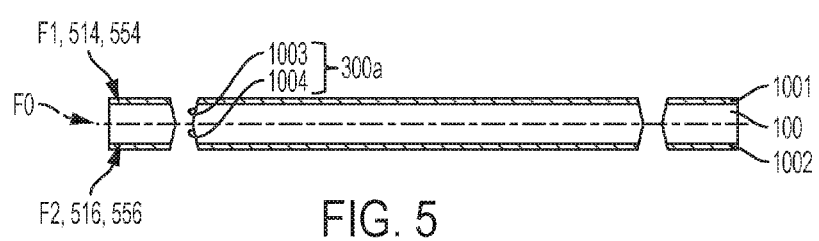
FIG. 5 is a view to illustrate a first operation for forming through-hole conductors in a substrate and conductive layers on the substrate.

Specifically, as shown in FIG. 4, a $CO_2$ laser 900, for example, is used to irradiate double-sided copper-clad laminate 1000 from the first-surface (F1, 514, 554) side to form hole 1003, and to irradiate double-sided copper-clad laminate 1000 from the second-surface (F2, 516, 556) side to form hole 1004 (FIG. 5). The shapes and sizes of hole 1003 and hole 1004 may be any suitable shape and/or size. Holes (1003, 1004) are formed at substantially the same location on the X-Y plane, and they are ultimately connected to form through hole (300a) which penetrates through double-sided copper-clad laminate 1000. The shape of through hole (300a) is like an hourglass, corresponding to through-hole conductor (300b) (see FIG. 7), for example. The boundary of hole 1003 and hole 1004 corresponds to narrowest portion (300c) (see FIGS. 5-7). Laser irradiation at the first surface (F1) and laser irradiation at the second surface (F2, 516, 556) may be conducted simultaneously or one surface at a time. After through hole (300a) is formed, desmearing on through hole (300a) is preferred to be conducted. Unwanted conduction (short circuiting) is suppressed by desmearing. In addition, to improve the absorption efficiency of laser light, black-oxide treatment may be conducted on surfaces of copper foils (1001, 1002) prior to laser irradiation. Instead of using a laser, through hole (300a) may be formed using a drill, etching or the like. However, fine processing is made easier by processing with a laser. Especially, since it is difficult to use a drill when the thermal expansion coefficient of substrate 100, 512, 552 is low, laser processing is effective.

Figure 6:
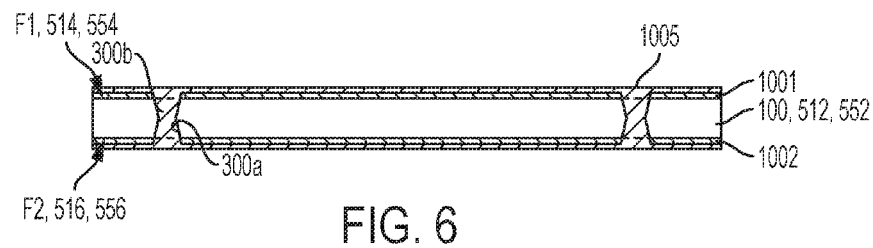
FIG. 6 is a view to illustrate a second operation subsequent to the operation in FIG. 9.

Next, using a panel plating method, for example, copper plating 1005, for example, is formed on copper foils (1001, 1002) and in through hole (300a) as shown in FIG. 6. Specifically, plating is performed. In one embodiment, electroless plating is first performed, followed by electrolytic plating with the electroless plated film as a seed layer using a plating solution to form plating 1005. Accordingly, plating 1005 is filled in through hole (300a), and through-hole conductor (300b) is formed.

Figure 7:
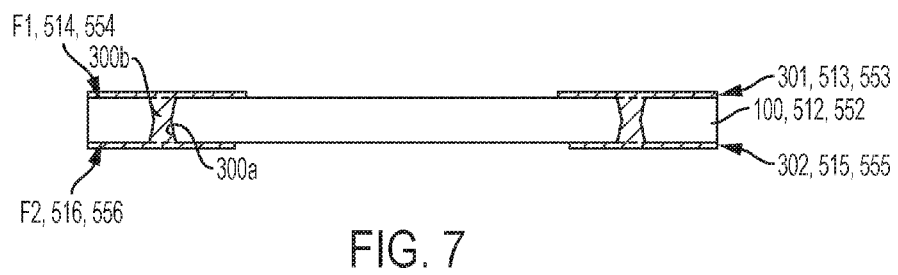
FIG. 7 is a view to illustrate a third operation subsequent to the operation in FIG. 10.

Next, using an etching resist deposited on the substrate and an etching solution, for example, each conductive layer formed on first surface (F1, 514, 554) and second surface (F2, 516, 556) of substrate 100, 512, 552 is patterned. Specifically, each conductive layer is covered by etching resist with a pattern corresponding to conductive layer 301, 513,553 or 302, 515,555, and portions of each conductive layer not covered by etching resist (portions exposed through opening portions of etching resist) are etched away. In doing so, conductive layers (301, 513,553; 302, 515,555) are respectively formed on first surface (F1, 514, 554) and second surface (F2, 516, 556) of substrate 100, 512, 552 as shown in FIG. 7. Any suitable form of metal etching may be employed. Etching is not limited to a wet type, and a dry type may also be employed.

Figure 8A:
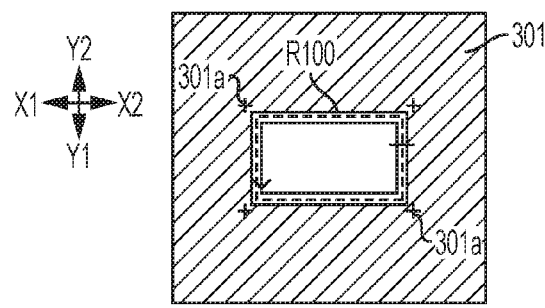
FIG. 8A is a view showing a first example of the shape of a conductive layer formed by the operations shown in FIGS. 5-7.
Figure 10:
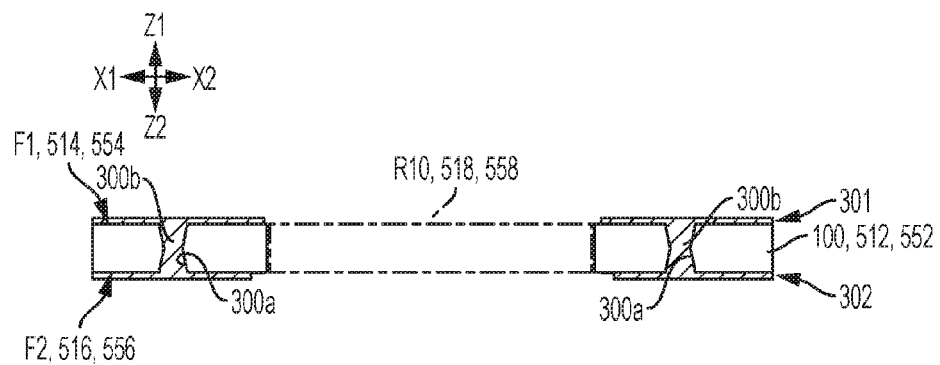
FIG. 10 is a view showing a substrate after the cavity is formed in the manufacturing method shown in FIG. 3.

In the present embodiment, a conductive layer 301, 513, 553 is not formed on substrate 100, 512, 552 in region (R100) as shown in FIG. 8A corresponding to cavity (R10, 518, 558) as later shown in FIG. 10, for example. If conductive layer 301, 513, 553 has such a conductive pattern, since the position and the shape of cavity (R10, 518, 558) to be formed are clear, forming the cavity in a later operation (operation (S13) in FIG. 3) with cavity forming tool 511, such as by use of a punch, router, or other cavity forming tool, is easier.

Figure 8B:
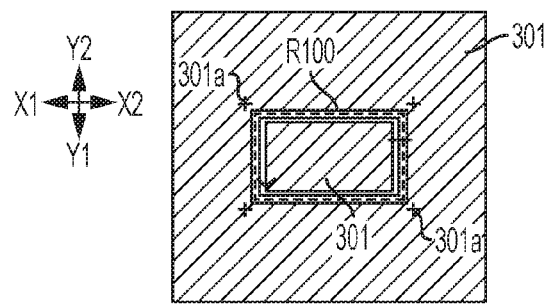
FIG. 8B is a view showing a second example of the shape of a conductive layer formed by the operations shown in FIGS. 9-11.

However, the conductive pattern of conductive layer 301, 513,553 is not limited to the pattern shown in FIG. 8A. For example, as shown in FIG. 8B, it is an option to remove conductive layer 301, 513,553 only from the portion on substrate 100, 512, 552 to be removed in a later operation (operation (S13) in FIG. 3), such as by use of a punch, router, or other cavity forming tool, is easier. In such a case, conductive layer 301, 513,553 exists inside the portion to be removed by the cavity forming tool. When conductive layer 301, 513,553 is formed as above, aligning the cavity forming tool is also easier when forming cavity (R10, 518, 558, shown in FIG. 10).

Also, as shown in FIG. 8A, conductive layer 301, 513,553 has alignment marks (301a) in the present embodiment. Alignment mark (301a) is a pattern optically recognizable in a later operation (operation (S14) in FIG. 3), for example, and is formed by partially removing the conductor through etching or the like, for example. In the present embodiment, alignment marks (301a) are arranged around region (R100) (four corners, for example). However, that is not the only option. Any suitable shape and position or location of alignment mark (301A) may be used. The positioning and the shape of alignment marks (301a) are not limited specifically.

Figure 9:
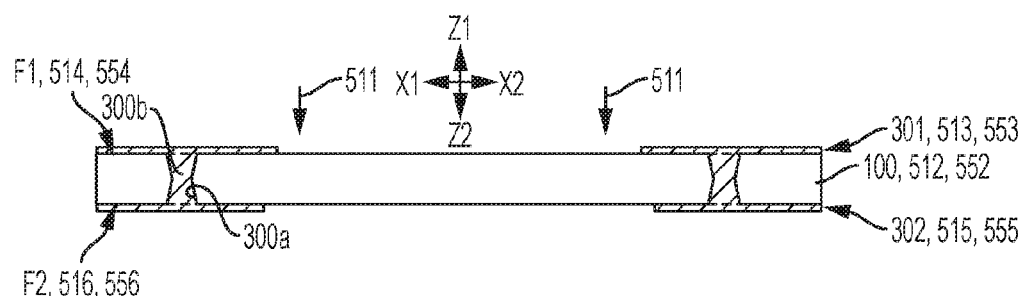
FIG. 9 is a view to illustrate a operation for forming a cavity in the manufacturing method shown in FIG. 3.

Next, in operation (S13) in FIG. 3, cavity (R10, 518, 558, of FIG. 10) is formed in substrate 100, 512, 552 (core substrate). In the present embodiment, a cavity forming tool 511, (of FIG. 9) such as a mechanical punch or router or other cavity forming tool, is brought into contact with substrate 100, 512, 552 as shown in FIG. 9 to form cavity (R10, 518, 558) as shown in FIG. 10. Specifically, as shown in FIG. 8A, for example, a cavity forming tool 511 is used to remove a shape, such as a rectangle so that region (R100) of substrate 100, 512, 552 corresponding to cavity (R10, 518, 558) is cut off from its surrounding portion. The cavity forming tool 511 is introduced substantially perpendicular to first surface (F1, 514, 554) of substrate 100, 512, 552; for example. Accordingly, cavity (R10, 518, 558) is formed as shown in FIG. 10. Since cavity (R10, 518, 558) is formed by a cavity forming tool 511, it is easy to form cavity (R10, 518, 558) in the present embodiment. Cavity (R10, 518, 558) becomes an accommodation space for chip capacitor 200, 522, 562.

Next, in operation (S14) in FIG. 3, chip capacitor 200, 522, 562 is positioned in cavity (R10, 518, 558) in substrate 100, 512, 552.

Figure 11:
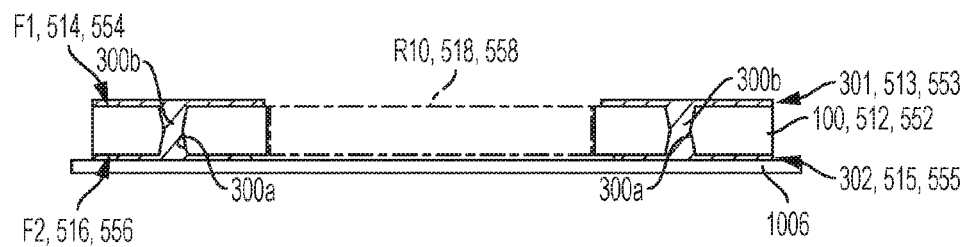
FIG. 11 is a view to illustrate an operation for attaching the substrate having the cavity to a carrier in the manufacturing method shown in FIG. 3.

Specifically, carrier 1006 made of any suitable material, including adhesive tape or PET (polyethylene terephthalate), for example, is arranged on one side of substrate 100, 512, 552 (second surface (F2), for example) as shown in FIG. 11. Accordingly, one opening of cavity (R10) (hole) is covered by carrier 1006. In the present embodiment, carrier 1006 is made of an adhesive sheet (such as a tape), and its adhesive side faces substrate 100, 512, 552. Carrier 1006 is adhered to substrate 100, 512, 552 by lamination, for example.

Figure 12:
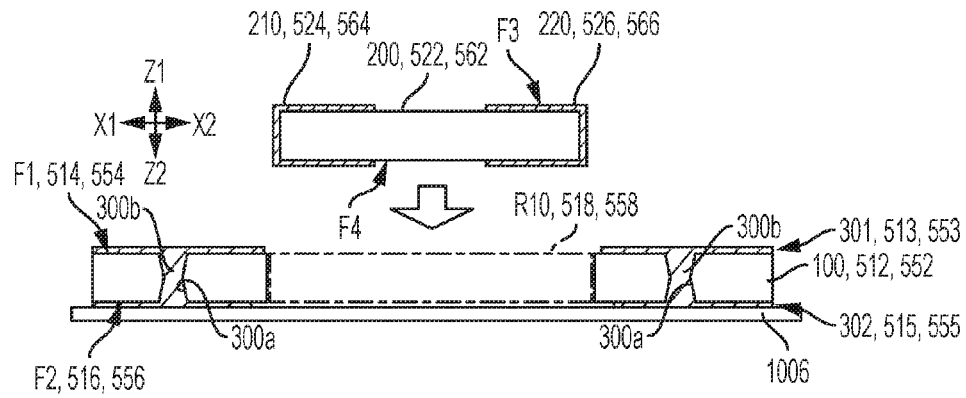
FIG. 12 is a view to illustrate an operation for positioning a capacitor in the cavity in the manufacturing method shown in FIG. 3.
Figure 13:
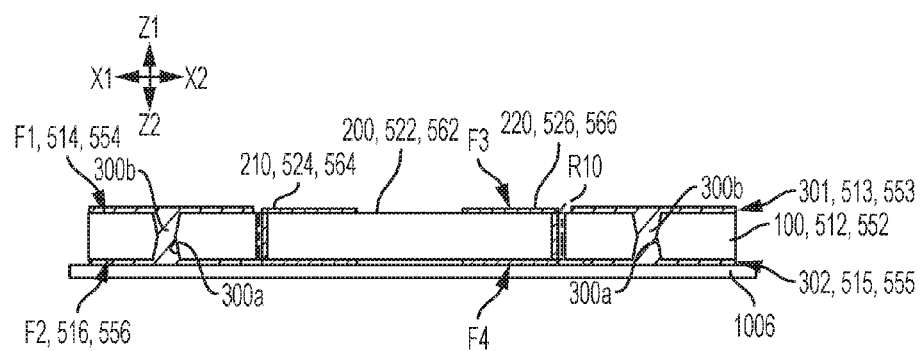
FIG. 13 is a view showing a state in which a capacitor is positioned in the cavity in the manufacturing method shown in FIG. 3.

Next, chip capacitor 200, 522, 562 is placed into cavity (R10, 518, 558) from the opening (Z1 side) opposite the covered opening of cavity (R10, 518, 558) (hole) as shown in FIG. 12. Chip capacitor 200, 522, 562 is put into cavity (R10, 518, 558) using a component mounter, for example. For example, chip capacitor 200, 522, 562 is held on a vacuum chuck or the like, transported to the area above cavity (R10, 518, 558) (Z1 side), lowered vertically from that area, and put into the cavity. Accordingly, chip capacitor 200, 522, 562 is positioned on carrier 1006 (adhesive sheet) as shown in FIG. 13. When determining the position of the chip capacitor 200, 522, 562, alignment marks (301a) (see FIGS. 8A, 8B) are preferred to be used. In doing so, the alignment accuracy of chip capacitor 200, 522, 562 and cavity (R10, 518, 558) is enhanced.

Surfaces of first and second electrodes (210, 524, 564; 220, 526, 566) of chip capacitor 200, 522, 562 and conductive layers (301, 513, 553; 302, 515, 555) are not roughened in the present embodiment. However, they may be roughened by etching or the like depending on requirements.

Figure 14:
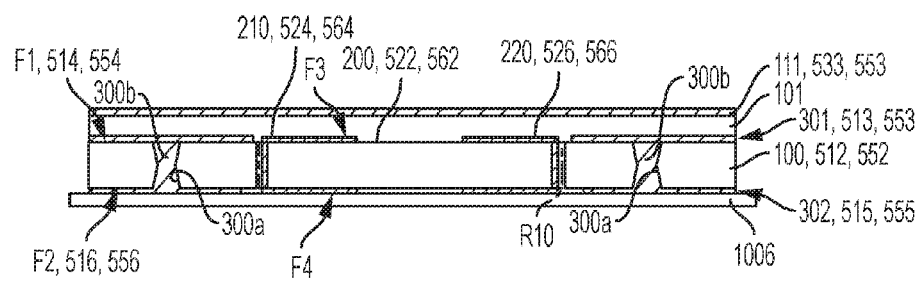
FIG. 14 is a view to illustrate an operation for forming a first interlayer insulation layer and a first copper foil on the insulative substrate and on the capacitor in the manufacturing method shown in FIG. 3.
Figure 15A:
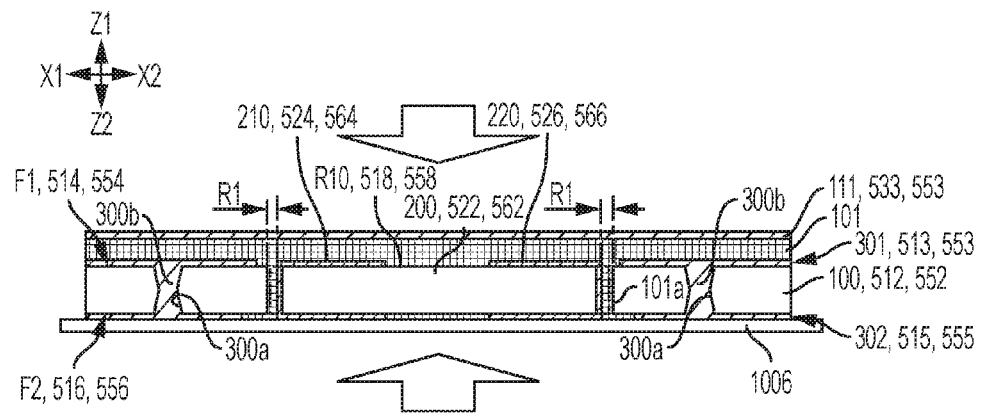
FIG. 15A is a view to illustrate a pressing operation in the manufacturing method shown in FIG. 3.
Figure 15B:
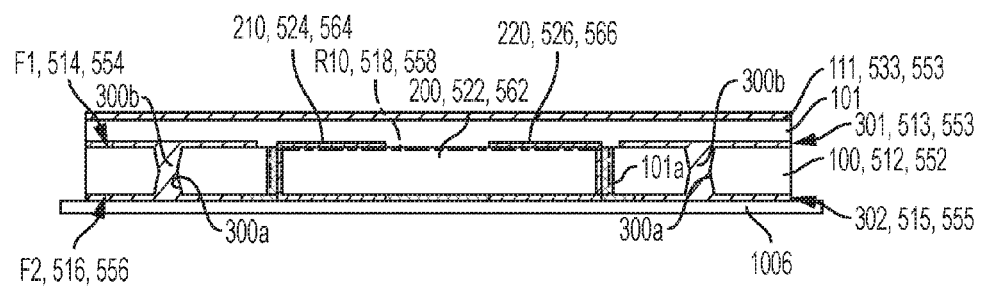
FIG. 15B is a view showing a state after the pressing in FIG. 19.

Next, in operation (S15) in FIG. 3, semi-cured insulation layer 101 (precursor of first interlayer insulation layer) is placed on first surface (F1, 514, 554) of substrate 100, 512, 552 and on the third surface (F3) of capacitor 200, 522, 562, which is the opposite side (Z1 side) to the covered opening of cavity (R10, 518, 558) (hole), as shown in FIG. 14. Furthermore, copper foil 111 (first copper foil) is placed on first insulation layer 101, 528, 568. First insulation layer 101 is made of glass-epoxy prepreg, for example. Then, as shown in FIG. 15A, resin is flowed from insulation layer 101 to cavity (R10) by pressing semi-cured insulation layer 101. Accordingly, insulator (101a) (resin of insulation layer 101) is filled in clearance (R1) between substrate 100, 512, 552 and chip capacitor 200, 522, 562 in cavity (R10, 518, 558) as shown in FIG. 15B. During that time, if the clearance is narrow between substrate 100, 512, 552 and chip capacitor 200, 522, 562, the intensity of resin flowing into cavity (R10, 518, 558) seldom causes positional shifting or unwanted inclining of capacitor 200, 522, 562 even if the chip capacitor is not securely fixed. Here, insulator (101a) has a greater thermal expansion coefficient than any of substrate 100, 512, 552 or chip capacitor 200, 522, 562.

After insulator (101a) is filled in cavity (R10), the filled resin (insulator 101a) and capacitor 200 are preliminarily adhered. Specifically, the filled resin is heated to gain retention power to a degree that it can support capacitor 200. In doing so, capacitor 200 supported by carrier 1006 is supported by the filled resin. Then, carrier 1006 is removed.

At this stage, insulator (101a) (filled resin) and insulation layer 101 are only semi-cured, not completely cured. However, that is not the only option, and insulator (101a) and insulation layer 101 may be completely cured at this stage, for example, to form cured first insulation layer 101, 528, 568.

Next, in operation (S16) in FIG. 3, a buildup section is formed on the second-surface (F2, 516, 556) side of substrate 100, 512, 552.

Figure 16:
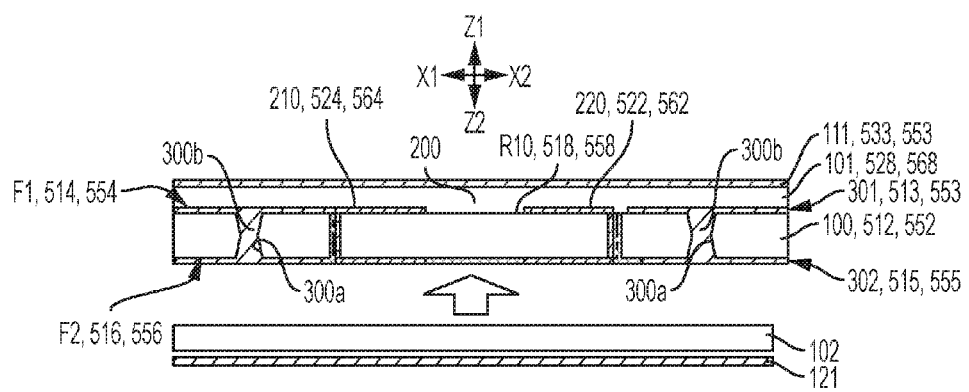
FIG. 16 is a view, in the manufacturing method shown in FIG. 3, to illustrate an operation for forming a second interlayer insulation layer and a second copper foil on the insulative substrate and on the capacitor after the carrier is removed.

Specifically, insulation layer 102 (precursor of second interlayer insulation layer) and copper foil 121 (second copper foil) are positioned on second surface (F2) of substrate 100 as shown in FIG. 16. Insulation layer 102 is made of glass-epoxy prepreg, for example. Then, semi-cured insulation layer 102 is adhered to substrate 100, 512, 552 and chip capacitor 200, 522, 562 by pressing, for example, and insulation layers (101, 102) are each thermally cured to form (cured) first insulation layer 101, 528, 568 and (cured) second insulation layer 103, 532, 572. In the present embodiment, since the resin filled in cavity (R10, 518, 558) is cured after adhesive sheet (carrier 1006) is removed, insulation layers (101, 102) can be simultaneously cured. By curing insulation layers (101, 102) on both surfaces simultaneously, warping in substrate 100, 512, 552 is suppressed, and it is easier to make thinner substrate.

In the subsequent operation (S17) in FIG. 3, via conductors and conductive layers are formed.

Figure 17:
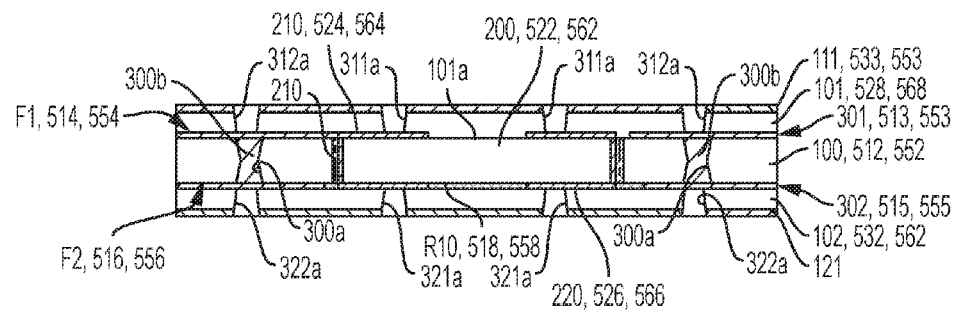
FIG. 17 is a view, in the manufacturing method shown in FIG. 3, to illustrate a first operation for forming conductive layers on the first and second interlayer insulation layers and for electrically connecting conductive patterns of each conductive layer to electrodes of the capacitor.

In particular, by using a laser, for example, holes (311a, 312a) (each a via hole) are formed in cured insulation layer 101, 528, 568, and copper foil 111, and holes (321a, 322a) (each a via hole) are formed in cured insulation layer 102, 532, 572 and copper foil 121, as shown in FIG. 17. Holes (311a, 312a) each penetrate through cured insulation layer 101, 528, 568 and copper foil 111, and holes (321a, 322a) each penetrate through cured insulation layer 102, 532, 572 and copper foil 121. Then, holes (311a, 321a) each reach electrode 210, 524, 564 or 220, 526, 566 of capacitor 200, 522, 562, and holes (312a, 322a) each reach a spot directly on through-hole conductor (300b). Then, desmearing is conducted depending on requirements.

Figure 18A:
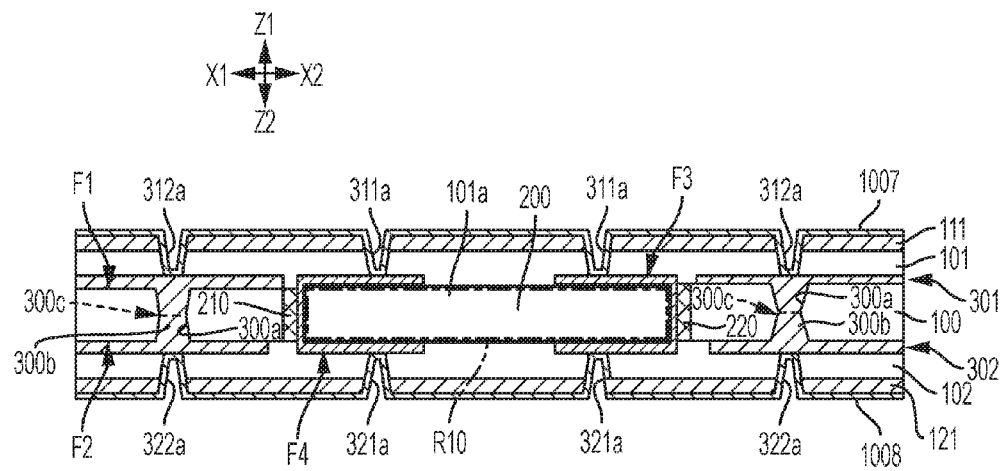
FIG. 18A is a view to illustrate a second operation subsequent to the operation in FIG. 21.

Next, as shown in FIG. 18A (duplicated numbering was discontinued on FIGS. 18A-19 due to space limitations, but will be understood by those skilled in the art to be applicable to these figures also), using a chemical plating method, for example, plated films, such as electroless copper-plated films (1007, 1008), for example, are formed on copper foils (111, 121) and in holes (311a, 312a, 321a, 322a). Prior to electroless plating, a catalyst made of palladium or the like may be adsorbed on surfaces of insulation layers (101, 102) by immersion, for example.

Figure 18B:
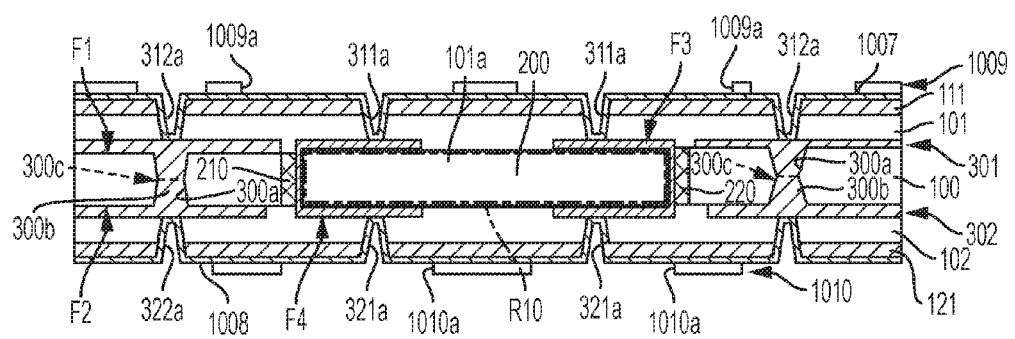
FIG. 18B is a view to illustrate a third operation subsequent to the operation in FIG. 22A.
Figure 19:
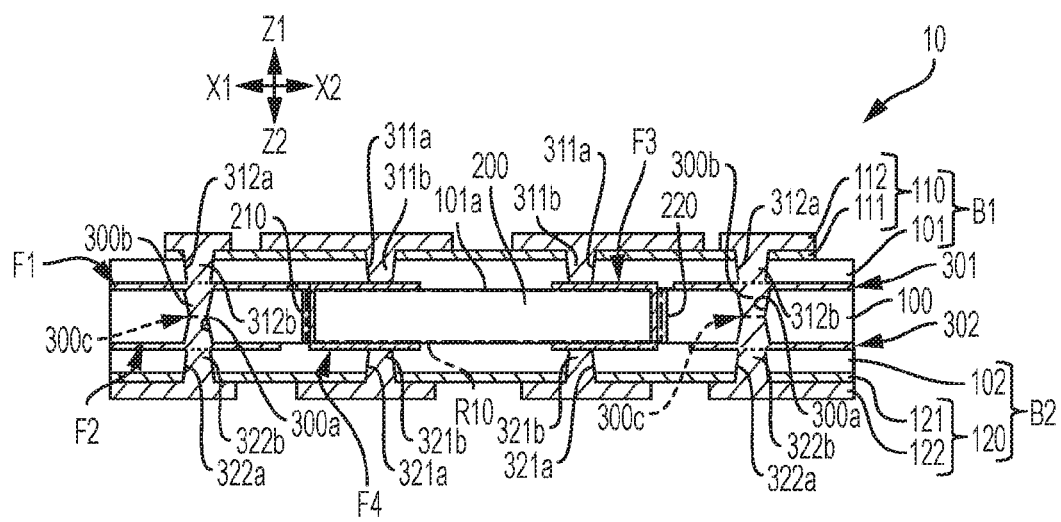
FIG. 19 is a view to illustrate a fifth operation subsequent to the operation in FIG. 22C.

Next, as shown in FIG. 18B, by use of a lithographic technique, printing or the like, plating resist 1009 having opening portions (1009a) is formed on the first-surface (F1, 514, 554) side main surface (on electroless plated film 1007), and plating resist 1010 having opening portions (1010a) is formed on the second-surface (F2, 516, 556) side main surface (on electroless plated film 1008). Opening portions (1009a, 1010a) have patterns respectively corresponding to conductive layers (110, 120) (FIG. 19).

Figure 18C:
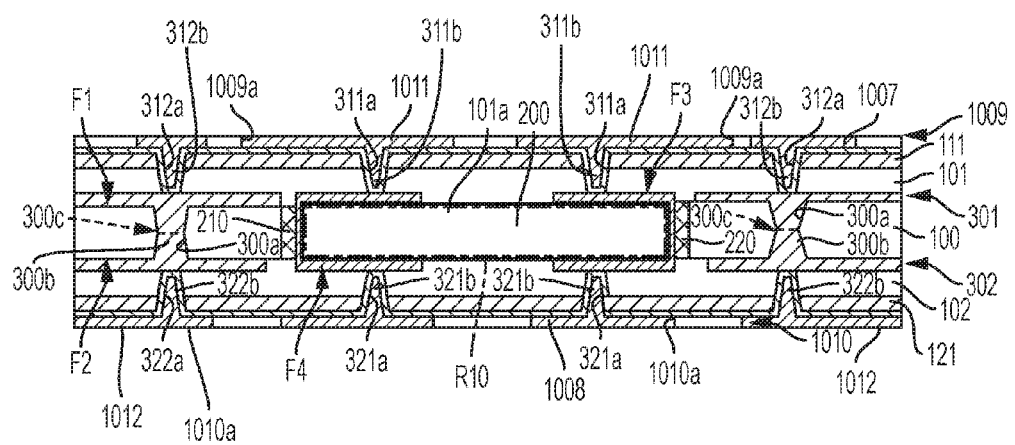
FIG. 18C is a view to illustrate a fourth operation subsequent to the operation in FIG. 22B.

Next, as shown in FIG. 18C, using a pattern plating method, for example, electrolytic copper platings (1011, 1012), for example, are formed respectively in opening portions (1009a, 1010a) of plating resists (1009, 1010). Specifically, copper as plating material is connected to the anode, and electroless plated films (1007, 1008) as material to be plated are connected to the cathode, and then the substrate is immersed in a plating solution. Then, DC voltage is applied between both poles to flow current so that copper is deposited on surfaces of electroless plated films (1007, 1008). Accordingly, electrolytic platings (1011, 1012) are respectively filled in via holes (311a, 312a) and via holes (321a, 322a) to form via conductors (311b, 312b, 321b, 322b) made of copper plating, for example. The completed first capacitor carrier layer 510 and/or second capacitor layer 520 may then be utilized in accordance with the method 1 of making a wiring board described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A wiring board, comprising:
    a bonded laminate, the bonded laminate comprising:
        a first capacitor carrier layer having a first chip capacitor embedded therein;
        a second capacitor carrier layer having a second chip capacitor embedded therein;
        an upper insulation layer disposed on an upper surface of a first insulation layer of the first capacitor carrier layer;
        a center insulation layer disposed on a lower surface of a second insulation layer of the first capacitor carrier layer, the center insulation layer including cured polymer, the second capacitor carrier layer disposed on a lower surface of the center insulation layer; and
        a lower insulation layer disposed on a lower surface of a second insulation layer of the second capacitor carrier layer.

2. The wiring board of claim 1, wherein:
    the first capacitor carrier layer comprises: a first core substrate having an upper surface, a lower surface, and a first opening portion, the first chip capacitor embedded in the first opening portion having a first electrode and a second electrode, the first insulation layer disposed on the upper surface, the second insulation layer disposed on the lower surface, a first upper conductive via in conductive contact with the first electrode and extending through the first insulation layer, a second upper conductive via in conductive contact with the second electrode and extending through the first insulation layer, a first lower conductive via in conductive contact with the first electrode and extending through the second insulation layer, a second lower conductive via in conductive contact with the second electrode and extending through the second insulation layer; and
    the second capacitor carrier layer comprises: a second core substrate having an upper surface, a lower surface, and a second opening portion, the second chip capacitor embedded in the second opening portion having a first electrode and a second electrode, a first insulation layer disposed on the upper surface, the second insulation layer disposed on the lower surface, a first upper conductive via in conductive contact with the first electrode and extending through the first insulation layer, a second upper conductive via in conductive contact with the second electrode and extending through the first insulation layer, a first lower conductive via in conductive contact with the first electrode and extending through the second insulation layer, a second lower conductive via in conductive contact with the second electrode and extending through the second insulation layer.

3. The wiring board of claim 1, further comprising at least one conductive through-hole that extends through the bonded laminate to an outer surface of the upper insulation layer and an outer surface of the lower insulation layer.

4. The wiring board of claim 3, wherein the conductive through-hole comprises a conductive coating formed on a through-hole bore, an insulator disposed on the conductive coating and filling the bore, and a pair of opposing conductive caps disposed on outer surfaces of the upper insulation layer and the lower insulation layer that are conductively connected to the conductive coating.

5. The wiring board of claim 3, wherein the at least one conductive through-hole comprises a plurality of conductive through-holes.

6. The wiring board of claim 1, wherein the first chip capacitor comprises a plurality of first chip capacitors embedded in a plurality of spaced apart first opening portions and the second chip capacitor comprises a plurality of second chip capacitors embedded in a plurality of spaced apart second opening portions.

7. The wiring board of claim 1, wherein:
the wiring board comprises a microprocessor bonding portion, and wherein the plurality of first chip capacitors and the plurality of second chip capacitors are embedded within the wiring board under the microprocessor bonding portion; and
a total number of the first chip capacitors and the second chip capacitors is 12-48.

8. The wiring board of claim 1, wherein the wiring board has a thickness of about 800 to about 1200 µm.

9. The wiring board of claim 1, wherein each of the upper insulation layer and the lower insulation layer includes cured polymer.

10. A method of making a wiring board, comprising:
forming a first capacitor carrier layer having a first chip capacitor embedded therein;
forming a second capacitor carrier layer having a second chip capacitor embedded therein;
forming a bonded laminate comprising an upper insulation layer disposed on an upper surface of a first insulation layer of the first capacitor carrier layer, a center insulation layer disposed on a lower surface of a second insulation layer of the first capacitor carrier layer, the center insulation layer including cured polymer, the second capacitor carrier layer disposed on a lower surface of the center insulation layer, and a lower insulation layer disposed on a lower surface of a second insulation layer of the second capacitor carrier layer;
forming a through-hole that extends through the bonded laminate to an outer surface of the upper insulation layer and an outer surface of the lower insulation layer; and
forming a conductive coating within the through-hole to provide a conductive through-hole.

11. The method of claim 10, wherein:
the first capacitor carrier layer comprises: a first core substrate having an upper surface, a lower surface, and a first opening portion, the first chip capacitor embedded in the first opening portion having a first electrode and a second electrode, the first insulation layer disposed on the upper surface, the second insulation layer disposed on the lower surface, a first upper conductive via in conductive contact with the first electrode and extending through the first insulation layer, a second upper conductive via in conductive contact with the second electrode and extending through the first insulation layer, a first lower conductive via in conductive contact with the first electrode and extending through the second insulation layer, a second lower conductive via in conductive contact with the second electrode and extending through the second insulation layer; and
the second capacitor carrier layer comprises: a second core substrate having an upper surface, a lower surface, and a second opening portion, the second chip capacitor embedded in the second opening portion having a first electrode and a second electrode, a first insulation layer disposed on the upper surface, the second insulation layer disposed on the lower surface, a first upper conductive via in conductive contact with the first electrode and extending through the first insulation layer, a second upper conductive via in conductive contact with the second electrode and extending through the first insulation layer, a first lower conductive via in conductive contact with the first electrode and extending through the second insulation layer, a second lower conductive via in conductive contact with the second electrode and extending through the second insulation layer.

12. The method of claim 11, wherein the first upper conductive via, the second upper conductive via, the first lower conductive via, and the second lower conductive via of the first capacitor carrier layer are configured for independent electrical connection to respective independent electrical conductors of the first capacitor carrier layer and the first upper conductive via, the second upper conductive via, the first lower conductive via, and the second lower conductive via of the second capacitor carrier layer are configured for independent electrical connection to respective independent electrical conductors of the second capacitor carrier layer.

13. The method of claim 10, further comprising:
filling the conductive through-hole with an insulator to form an insulator filled conductive through hole; and
forming an upper conductive cap and a lower conductive cap over the insulator filled conductive through hole.

14. The method of claim 10, further comprising aligning the first capacitor carrier layer relative to the second capacitor carrier layer so that the first chip capacitor is disposed above the second chip capacitor.

15. The method of claim 10, wherein the first chip capacitor comprises a plurality of first chip capacitors embedded in a plurality of spaced apart first opening portions and the second chip capacitor comprises a plurality of second chip capacitors embedded in a plurality of spaced apart second opening portions.

16. The method of claim 15, further comprising aligning the first capacitor carrier layer relative to the second capacitor carrier layer so that the first chip capacitors are disposed above respective second chip capacitors, wherein the wiring board comprises a microprocessor bonding portion, and wherein the plurality of first chip capacitors and the plurality of second chip capacitors are embedded within the wiring board under the microprocessor bonding portion.

17. The method of claim 10, wherein forming a bonded laminate comprises:
stacking, in sequence: an upper prepreg layer, the first capacitor carrier layer, a center prepreg layer, the second capacitor carrier layer, and a lower prepreg layer; and
laminating under pressure and temperature the upper prepreg layer, the center prepreg layer, and the lower prepreg layer to form the bonded laminate and the upper insulation layer, center insulation layer, and lower insulation layer.

18. The method of claim 17, wherein:

each of the upper prepreg layer, the center prepreg layer, and the lower prepreg layer includes uncured polymer; and laminating includes curing the uncured polymer resin in each of the upper prepreg layer, the center prepreg layer, and the lower prepreg layer.

19. The method of claim 10, wherein forming a through-hole that extends through the bonded laminate comprises mechanically drilling through the bonded laminate.

20. The method of claim 10, wherein each of the upper insulation layer and the lower insulation layer includes cured polymer.

* * * * *